United States Patent
Chaudhary

[19]

[11] Patent Number: 6,081,914
[45] Date of Patent: Jun. 27, 2000

[54] METHOD FOR IMPLEMENTING PRIORITY ENCODERS USING FPGA CARRY LOGIC

[75] Inventor: Kamal Chaudhary, San Jose, Calif.

[73] Assignee: Xilinx, Inc., San Jose, Calif.

[21] Appl. No.: 09/037,749

[22] Filed: Mar. 10, 1998

[51] Int. Cl.[7] .............................. G01R 31/28; G06F 7/38; H03K 19/177

[52] U.S. Cl. .......................... 714/724; 714/725; 326/39; 326/41

[58] Field of Search ........................... 714/718, 724–729; 326/39–41; 395/500.02, 500.07, 500.09, 500.13

[56] References Cited

U.S. PATENT DOCUMENTS

| | | | |
|---|---|---|---|
| 5,677,638 | 10/1997 | Young et al. | 326/39 |
| 5,809,035 | 9/1998 | Sikdar et al. | 714/718 |
| 5,870,309 | 2/1999 | Lawman | 395/500.07 |
| 5,889,411 | 3/1999 | Chaudhary | 326/39 |
| 5,910,898 | 6/1999 | Johannsen | 395/500.02 |

OTHER PUBLICATIONS

"The Programmable Logic Data Book" published Sep., 1996, pp. 4–11 to 4–23 and 4–184 to 4–190, available from Xilinx, Inc., 2100 Logic Drive, San Jose, CA 95124.

*Primary Examiner*—Emmanuel L. Moise
*Attorney, Agent, or Firm*—Lois D. Cartier

[57] ABSTRACT

The invention provides a method for implementing an HDL-specified priority encoder as carry logic in an FPGA. A first embodiment of the method includes the steps of: 1) detecting an priority determination statement in the HDL code; 2) implementing the highest priority test in the statement using a first carry multiplexer; and 3) implementing the next highest priority test in the statement using another carry multiplexer that accepts the output of the preceding carry multiplexer as a carry input; and 4) repeating step 3 until each test in the statement has been implemented. Another embodiment of the invention includes the additional steps of: 1) counting the number of tests performed in the priority determination statement; and 2) comparing the number of tests to a set threshold criterion, to determine whether it is appropriate to implement the statement using carry logic.

21 Claims, 9 Drawing Sheets

```
module priority_encoder (din, dout, a, b);
    output          dout;
    input   [15:0]  din;
    input   [15:0]  a;
    input   [15:0]  b;
    reg             dout;

always @(din or a or b)
    begin
            if (a[0] || b[0])
                    dout <= din[0];
            else if (a[1] && b[1])
                    dout <= din[1];
            else if (a[2] && b[2])
                    dout <= din[2];
            else if (a[3] && b[3])
                    dout <= din[3];
            else if (a[4] && b[4])
                    dout <= din[4];
            else if (a[5] && b[5])
                    dout <= din[5];
            else if (a[6] && b[6])
                    dout <= din[6];
            else if (a[7] && b[7])
                    dout <= din[7];
            else if (a[8] && b[8])
                    dout <= din[8];
            else if (a[9] && b[9])
                    dout <= din[9];
            else if (a[10] && b[10])
                    dout <= din[10];
            else if (a[11] && b[11])
                    dout <= din[11];
            else if (a[12] && b[12])
                    dout <= din[12];
            else if (a[13] && b[13])
                    dout <= din[13];
            else if (a[14] && b[14])
                    dout <= din[14];
            else if (a[15] && b[15])
                    dout <= din[15];
            else
                    dout <= 1'b1;
    end
endmodule
```

FIG. 1

METHOD FOR IMPLEMENTING PRIORITY ENCODERS USING FPGA CARRY LOGIC

BACKGROUND OF THE INVENTION

1. Field of the Invention

The invention relates to Field Programmable Gate Arrays (FPGAs). More particularly, the invention relates to a method for synthesizing priority encoders into carry logic in an FPGA.

2. Description of the Background Art

Programmable integrated circuits (ICs) are a well-known type of integrated circuit that may be programmed by a user to perform specified logic functions. (The term "programmable ICs" as used herein includes but is not limited to FPGAs, mask programmable devices such as Application Specific ICs (ASICs), Programmable Logic Devices (PLDs), and devices in which only a portion of the logic is programmable.) One type of programmable IC, the field programmable gate array (FPGA), typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBS, IOBs, and interconnect structure are configured. The configuration data may be read from memory (e.g., an external PROM) or written into the FPGA by an external device. The collective states of the individual memory cells then determine the function of the FPGA.

A CLB typically includes one or more function generators (often implemented as lookup tables, or LUTs), and one or more registers that can optionally be used to register the LUT outputs. Some CLBs also include carry logic that is used to implement arithmetic functions such as adders, subtractors, counters, and multipliers. Implementing logic using carry chains can be faster, sometimes much faster, than implementing the equivalent logic in LUTs. The speed of a carry chain depends on the number of bits in the carry chain (among other factors). The speed of the equivalent logic implemented as LUTs depends on the number of levels of logic (i.e., the number of LUTs on the slowest path) required to implement the carry function. However, the use of carry logic imposes placement constraints in that the ordering of the bits in the FPGA implementing a user's function is set by the carry chain.

Two forms of design entry are common: schematic entry and Hardware Description Languages (HDLs) such as Verilog and VHDL. When schematic entry is used, the designer can specify the exact implementation desired for his circuit. However, when HDL code is used, the circuit is described by its logical function. Synthesis software then translates the logical function into specific logic targeted for a specified FPGA. Although circuit elements can be manually instantiated in HDL code, this method is avoided since it is labor-intensive and the code can typically only be targeted to a specific programmable IC architecture.

Well-known synthesis tools such as those distributed by Synopsys, Inc., of Mountain View, Calif., recognize arithmetic functions in the HDL code and implement these functions using carry logic. However, other types of statements used in HDL code are not so implemented, even when the method that is used results in a much slower circuit. For example, Synopsys synthesis tools recognize two constructs currently implemented using LUTs: priority encoder constructs and multiplexer constructs. These two constructs are sometimes implemented differently, although they are based on similar HDL statements.

A priority encoder construct is inferred when a priority determination statement has been used in the Verilog code. Verilog supports two types of priority determination statements, if/else statements and case/switch statements. An if/else statement is a well-known programming concept, although the syntax varies in different HDLs. In Verilog, an if/else statement takes the form:

```
if (test0)
    do_result0;
else if (test1)
    do_result1;
else if (test2)
    do_result2;
...
else do_default_result;
end
```

The else if and else portions of an if/else statement are optional. If none of the tests returns True, the default result is performed.

A case/switch statement has a similar function, but uses a different syntax. In Verilog, a case/switch statement takes the form:

```
case (variable)
test0 : do_result0;
test1 : do_result1;
...
default : do_default_result;
end
```

The default portion of a case/switch statement is optional. In a case/switch statement, the case portion defines a variable; and each test compares the value of the variable to a given test value. If the variable has none of the tested values, the default result is performed.

A priority encoder selects from among two or more results based on a sequential series of "tests", as shown in the exemplary Verilog code of FIG. 1. Once a test has been passed, the specified result is selected, and any remaining tests are not performed. (Hence the name "priority encoder".) For example, if the test in line 9 of FIG. 1 (a[0] || b[0]) returns False (i.e., if neither a[0] nor b[0] is True), the test in line 11 (a[1] && b[1]) is performed. If this second test returns True (i.e., if both a[1] and b[1] are True), then output "dout" is set to "din[1]" as specified in line 12.

A multiplexer construct is inferred when a parallel case/switch statement is used. A parallel case/switch statement is a statement in which the person writing the code specifies that only one of the tests will be True at a given time. (This specification is typically done by adding a comment, where the format of the comment varies depending on the synthesis software used.) Therefore, although synthesis software typically treats multiplexers and priority encoders as two separate constructs, a multiplexer is a limited form of a priority encoder, where only one of the tests can be True at a given time.

Using priority determination statements can greatly simplify the task of entering a logic description of a circuit, but present synthesis methods typically implement such statements as logic that spans many levels of LUTs, thereby limiting the performance of the resulting design. It would be desirable for synthesis tools to implement priority determination statements as carry logic, when doing so results in a faster design.

SUMMARY OF THE INVENTION

The invention provides a method for implementing an HDL-specified priority encoder as carry logic in an FPGA. A first embodiment of the method includes the steps of: 1) detecting a priority determination statement in the HDL code; 2) implementing the highest priority test in the statement using a first carry multiplexer; and 3) implementing the next highest priority test in the statement using another carry multiplexer that provides the carry input signal to the carry multiplexer used in the previous step; and 4) repeating step 3 until each test in the statement has been implemented. Another embodiment of the invention includes the additional steps of: 1) counting the number of tests performed in the priority determination statement; and 2) comparing the number of tests to a set threshold criterion to determine whether it is appropriate to implement the statement using carry logic.

When the priority determination statement is an if/else or case/switch statement, the first test in the statement has the highest priority, the second test has the second highest priority, and so forth. Therefore, in these types of statements, the synthesis software need only scan the code and implement each test in the order it is encountered. In other types of priority determination statements, the priority of the tests may not follow their order in the code. In such non-linear priority determination statements, the synthesis software repeatedly scans the entire statement to detect the highest-priority test remaining to be implemented.

BRIEF DESCRIPTION OF THE DRAWINGS

The present invention is illustrated by way of example, and not by way of limitation, in the following figures, in which like reference numerals refer to similar elements.

FIG. 1 shows an exemplary Verilog module representing a priority encoder described using an if/else statement.

DETAILED DESCRIPTION OF THE DRAWINGS

Several examples of FPGA carry logic implementing a priority encoder according to the invention are described. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Method for Implementing a Priority Encoder

Figure 2A:
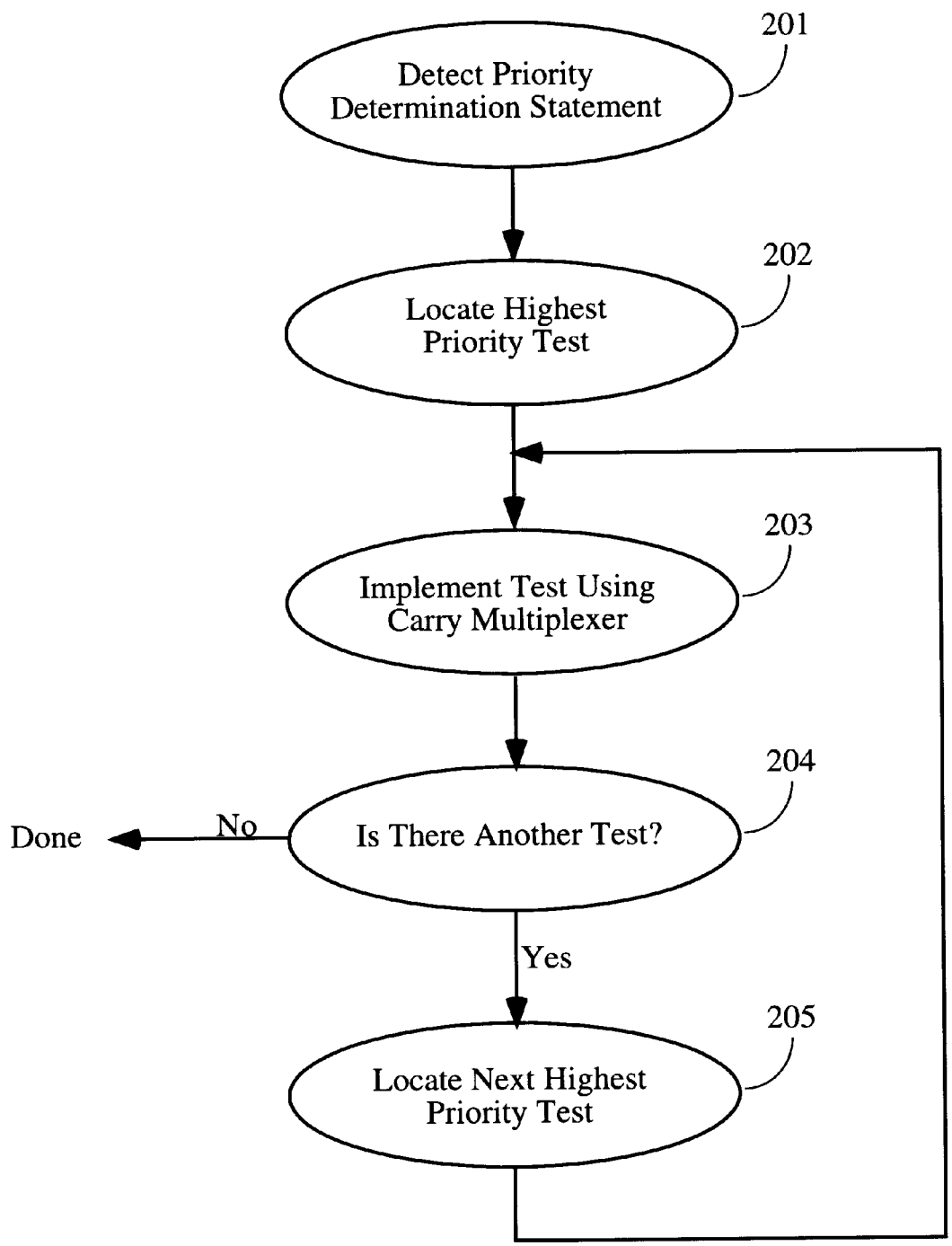
FIG. 2A shows a first flow diagram of the method of the invention.

FIG. 2A shows a first flow diagram of the steps of the invention. In step 201, a synthesis tool detects a priority determination statement in the HDL code. In step 202, the tool locates the highest priority test within the statement, and in step 203 implements the test using a carry multiplexer. Examples of how a test can be implemented using carry logic are described in connection with FIGS. 3–8. In step 204, the tool determines whether there is at least one more test in the priority determination statement. (Of course, the first time this step is encountered there should be another test; if not, the circuit is poorly coded). If there are no more tests, the implementation is complete; the tool exits the statement and continues processing the remaining HDL code. Otherwise, the tool locates the next highest priority test (step 205), and proceeds to implement the test as in step 203.

Figure 2B:
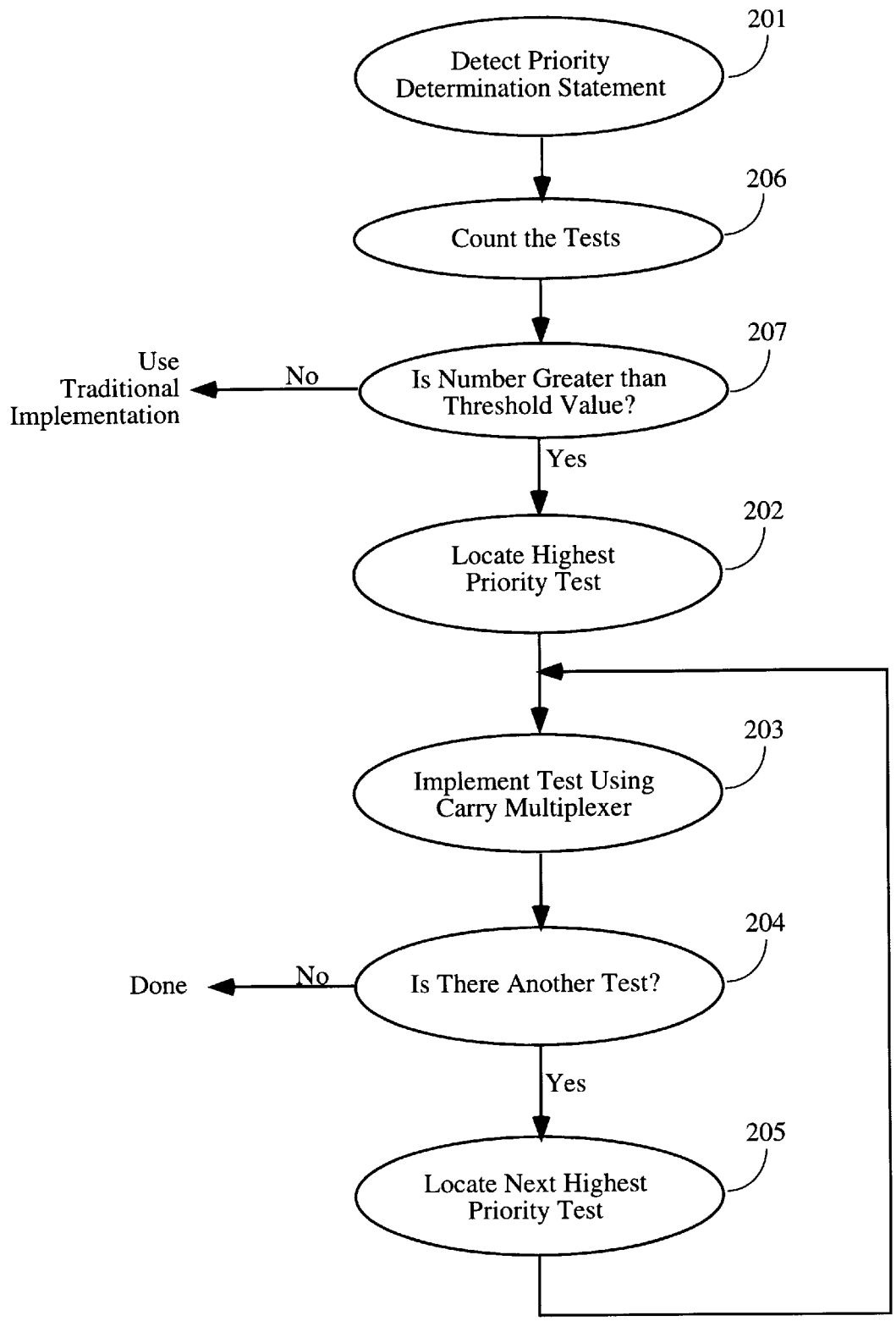
FIG. 2B shows a second flow diagram of the method of the invention.

FIG. 2B shows a variation on the flow diagram of FIG. 2A. In the method of FIG. 2B, when a priority determination statement is detected the tests are counted (step 206). The number of tests in the statement is compared to a known threshold value, to determine whether it is appropriate to implement the statement using carry logic. If not, the synthesis tool uses traditional methods to implement the priority encoder. If the number is greater than the threshold value, the tool proceeds to implement the encoder as in FIG. 2A.

Detailed Description of a First Embodiment

Figure 3:
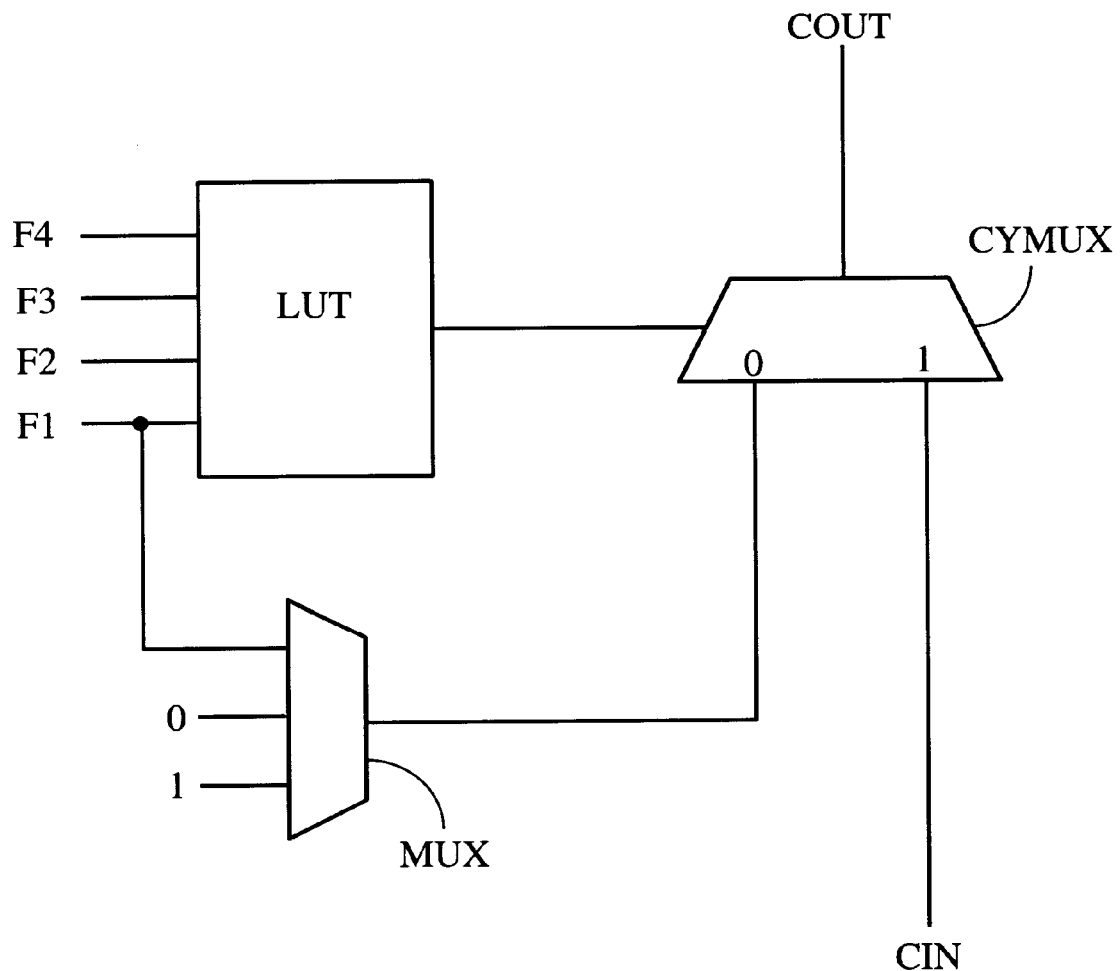
FIG. 3 shows the carry logic for a single LUT in the Virtex™ FPGA from Xilinx, Inc.

FIG. 3 shows a simplified portion of a CLB from the Xilinx Virtex FPGA. In this FPGA architecture, a single CLB includes four of the circuits shown in FIG. 3, as well as other logic. However, the circuit in FIG. 3 is treated as an independent entity for the purposes of this example. The circuit of FIG. 3 includes a carry multiplexer CYMUX having a "1" input terminal coupled to carry input line CIN, a "0" input terminal driven by multiplexer MUX, a carry output terminal coupled to carry output line COUT, and a carry select terminal coupled to the output terminal of lookup table LUT. Multiplexer MUX is driven by three data input lines, 0 (logic low), 1 (logic high), and lookup table input line F1. Input line F1 also provides an input signal to lookup table LUT, as do input lines F2, F3, and F4. Carry output line COUT is coupled to carry input line CIN of another copy of this circuit placed above FIG. 3. Carry input line CIN is coupled to carry output line COUT of another copy of this circuit placed below FIG. 3. Since the circuit is programmable, the length of the carry chain can be programmably varied, based on the number of such circuits needed to implement a given carry chain.

Figure 4:
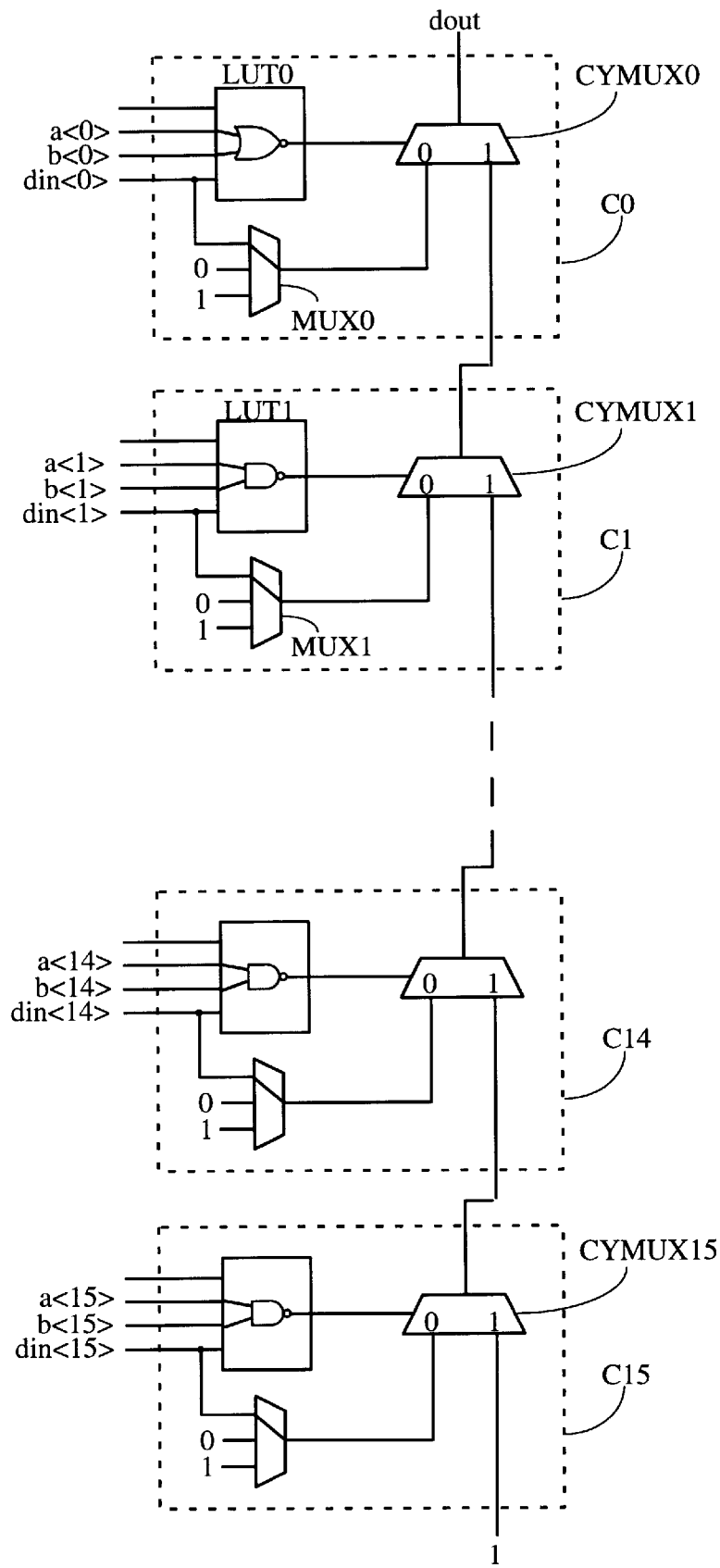
FIG. 4 shows a priority encoder implemented in the Virtex FPGA carry logic.

FIG. 4 shows how the priority encoder of FIG. 1 is implemented in the circuit of FIG. 3, according to a first embodiment of the invention. This priority encoder requires 16 copies of the circuit of FIG. 3, one per test in the HDL code of FIG. 1. The circuits are labeled C0, C1, . . . , C14, C15. (Only four circuits are shown in FIG. 4, in order to simplify the drawing.)

In FIG. 4, the output signal for the priority encoder is carried on line "dout". Line "dout" is driven by carry multiplexer CYMUXO in circuit C0, which circuit implements the first test. Input line din<0> drives multiplexer MUX0, which is programmed to provide the signal on line din<0> to the "0" input terminal of multiplexer CYMUX0. The "OR" function described in line 9 of FIG. 1 is implemented by lookup table LUT0, which is programmed as a 2-input NOR function with lines a<0> and b<0> providing the input signals. (Square brackets in HDL signal names are typically replaced by left and right arrows when the HDL code is compiled to form a circuit. Therefore, HDL signals a[0] and b[0] are translated into signal lines a<0> and b<0>.) The OR function of FIG. 1 is implemented in inverted form in order to select the "0" input of multiplexer CYMUX0. If either of lines a<0>, b<0> carries a high signal, lookup table LUT0 drives the carry select signal low, and the signal at the output terminal of multiplexer MUX0 (corresponding to the signal on line din<0>) is placed onto output line "dout". Circuit C0 therefore performs a test having the highest priority, since if the test is passed circuit C0 alone determines the output signal on line "dout".

If the first test was not passed, the output of lookup table LUT0 is high, selecting the signal on the "1" input terminal of carry multiplexer CYMUX0, which is the carry out signal from circuit C1. Circuit C1 resembles circuit C0, except that the test is different. As specified in line 11 of FIG. 1, the function implemented in lookup table LUT1 is a 2-input NAND function with lines a<1> and b<1> providing the input signals. The AND function of FIG. 1 is implemented in inverted form in order to select the "0" input of multiplexer CYMUX1. Circuits C2–C15 are the same as circuit C1 except for having different input lines. The carry in signal for multiplexer CYMUX15 in circuit C15 is a logic high in this implementation, as dictated by lines 41–42 of FIG. 1 (else dout<=1'b1 (binary 1)).

It may not always be advantageous to implement a priority encoder using carry logic. If the equivalent LUT circuit has few logic levels and the carry chain is slow, it may be desirable to use a LUT implementation. Following is an exemplary test calculation for the Xilinx Virtex FPGA.

The typical delay through a LUT logic level (referred to herein as one LUT delay) is easily estimated as the delay through a single LUT plus the typical net delay from LUT to LUT. The delay through a carry chain can be estimated using the following formula:

carry_delay=carry_on_delay+(N * carry_delay_per_bit) where carry_on_delay is the delay in getting onto the carry chain (through one LUT and one carry multiplexer, a total of about one-and-a-half LUT delays), N is the number of carry multiplexers in the chain (in this embodiment the number of tests in the statement), and carry_delay_per_bit is the delay from carry-in to carry-out of a single carry multiplexer. From current observations, carry_delay_per_bit for the Virtex FPGA is less than one-tenth of one LUT delay. Therefore, in units of one LUT delay:

carry_delay=1.5+(N/10)

For LUT implementations in the Virtex architecture, available synthesis software uses one level of logic for each two tests when implementing a priority encoder. (For many FPGA architectures, one level of logic is used for each test.) Therefore, in the Virtex FPGA a priority encoder with N tests requires N/2 LUT delays, or:

total_LUT_delay=N/2

Therefore, a LUT implementation is slower than a carry chain implementation when the following is true:

total_LUT_delay > carry_delay
N/2 > 1.5 + (N/10)
5N > 15 + N
4N > 15
N > 15/4

Therefore, for the Xilinx Virtex FPGA it is desirable to use a carry chain implementation for priority encoders whenever the encoder includes four or more tests.

A threshold criterion can be established for each FPGA architecture using a method similar to the one shown above. (The equations may differ in different FPGA architectures, but can easily be deduced by those of ordinary skill in the relevant arts based on the disclosures herein.) By comparing the number of tests in the priority determination statement to the established threshold criterion, the synthesis software can decide whether to use LUTs or carry logic to implement a priority encoder of a given size.

In the embodiment of FIGS. 3 and 4, the LUT can implement any select function with up to three inputs. One of the four LUT input terminals is unavailable, since the F1 LUT input terminal is used to provide an input signal to multiplexer MUX. In cases where a constant "0" or "1" is fed to the "0" input terminal of the carry multiplexer, the F1 LUT input terminal is not needed to implement the priority encoder. In these cases, the LUT can be used to implement any function of up to four inputs. Otherwise, only tests with up to three inputs can be implemented using a single CLB. For select functions having more than these numbers of inputs, additional LUTs from other CLBs can be used.

Detailed Description of a Second Embodiment

Figure 5:
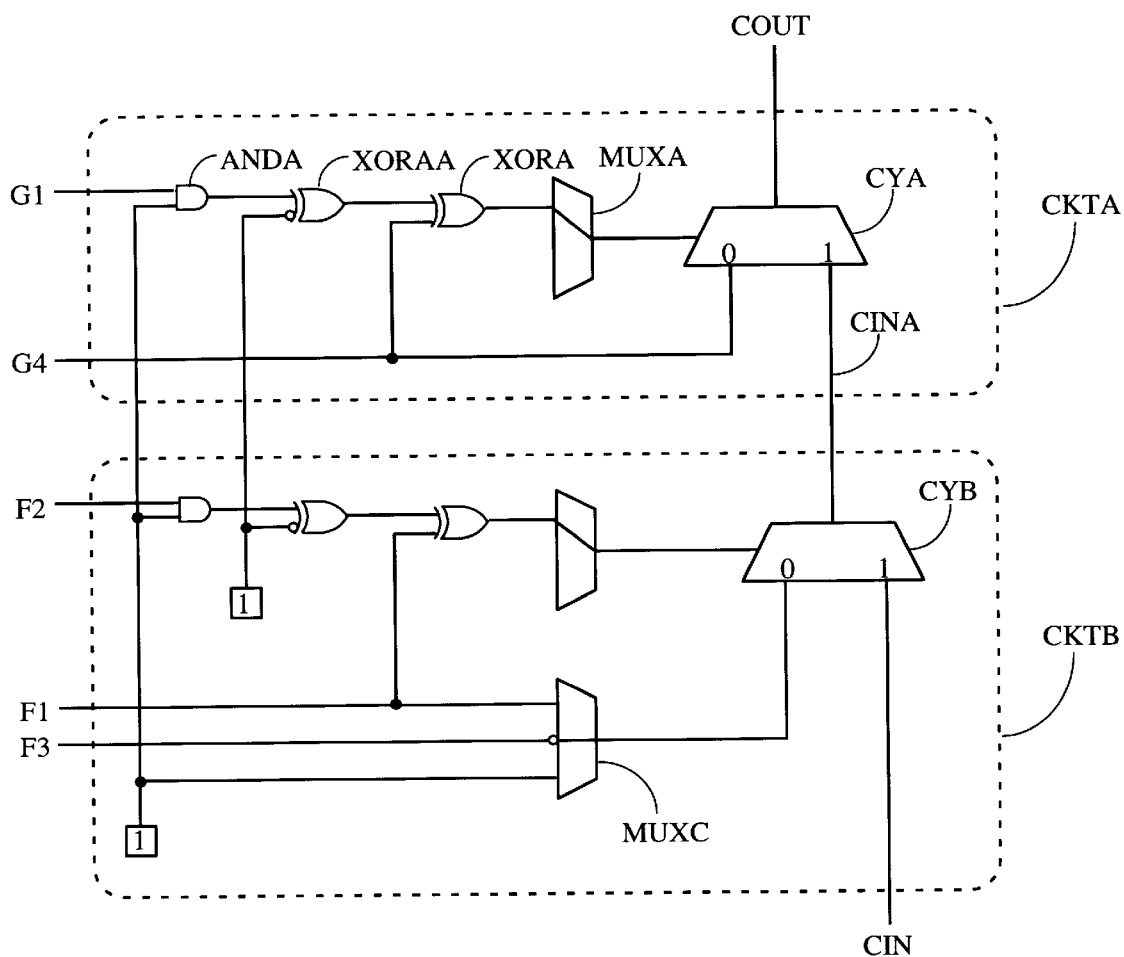
FIG. 5 shows the carry logic for an XC4000E™ FPGA from Xilinx, Inc.

FIG. 5 shows a simplified portion of a CLB from the Xilinx XC4000E FPGA. The XC4000 CLB is described in detail in pages 4-11 through 4-23 of the Xilinx 1996 Data Book entitled "The Programmable Logic Data Book" (hereinafter referred to as "the Xilinx Data Book"), published September, 1996, available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.) In this FPGA architecture, a single CLB includes one of the circuits shown in FIG. 5, as well as other logic. Each XC4000E CLB has two LUTs, and the circuit of FIG. 5 shows the carry logic associated with the two LUTs. FIG. 5 shows some portions of the XC4000E carry logic already programmed to pass signals through gates and multiplexers. More detailed diagrams of the XC4000E carry logic are shown on pages 4-22 and 4-23 of the Xilinx Data Book.

The circuit of FIG. 5 includes two similar circuits CKTA and CKTB. Circuit CKTA includes carry multiplexer CYA, which has a "1" input terminal coupled to carry input line CINA, a "0" input terminal coupled to LUT input line G4, a carry output terminal coupled to carry output line COUT, and a carry select terminal coupled to the output terminal of multiplexer MUXA. Multiplexer MUXA is driven by XOR-gate XORA, and is programmed to pass the XORA output signal on to the select input terminal of carry multiplexer CYA. Inputs signals are provided to XOR-gate XORA on input line G4 and by XOR-gate XORAA, which is programmed to accept the input of AND-gate ANDA and pass it to XOR-gate XORA. AND-gate ANDA is programmed to pass the signal on lookup table input line G1 to XOR-gate XORAA. Carry output line COUT is coupled to carry input line CIN of another copy of this circuit placed above FIG. 5. Carry input line CINA is coupled to the output terminal of carry multiplexer CYB in circuit CKTB.

Circuit CKTB is similar to circuit CKTA except that circuit CKTB also includes multiplexer MUXC, which is programmed to pass the signal on lookup table input line F3 to the "0" input terminal of carry multiplexer CYB. The "1" input terminal of carry multiplexer CYB is coupled to carry input line CIN, which is coupled to carry output line COUT of another copy of this circuit placed below FIG. 5.

Note that although FIG. 5 does not show either of the LUTs that are present in the CLB, circuit CKTA uses two LUT input terminals (G1, G4), which limits the functions that can be implemented in the LUT. Similarly, circuit CKTB uses three LUT input terminals (F1, F2, F3), severely limiting the functions that can be implemented in the other LUT in the CLB. Therefore, in this embodiment, the carry implementation of a priority decoder may require an additional LUT for each test, to implement the select logic.

Figure 6:
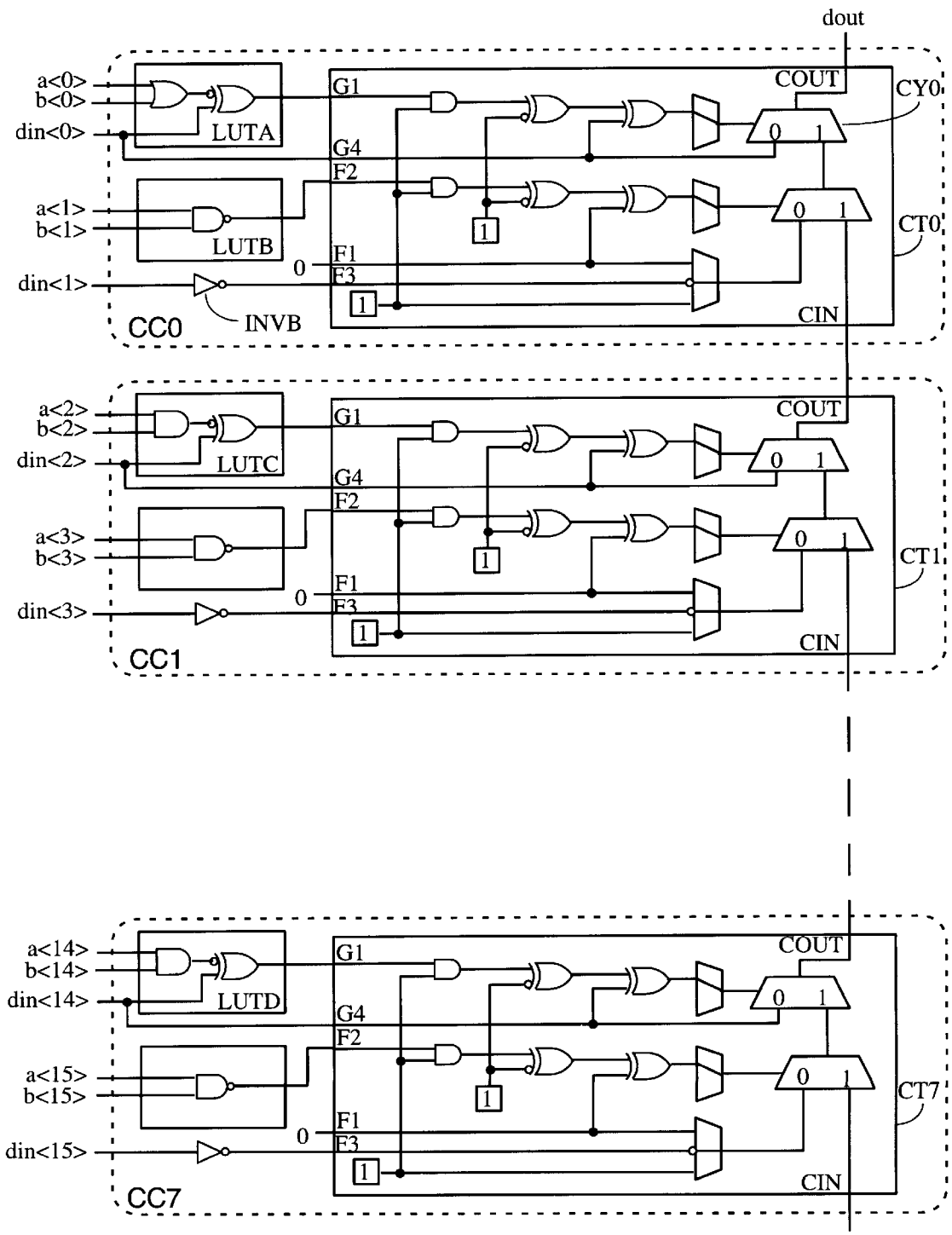
FIG. 6 shows a priority encoder implemented in the XC4000E FPGA carry logic.

FIG. 6 shows how the priority encoder of FIG. 1 is implemented in the carry circuit of FIG. 5, according to a second embodiment of the invention. This priority encoder requires eight copies of the circuit of FIG. 5, one for each two tests in the HDL code of FIG. 1. The eight carry circuits are labeled CT0, CT1, . . . , CT7. (Only three circuits are shown in FIG. 6, in order to simplify the drawing.)

In FIG. 6, the output signal for the priority encoder is carried on line "dout". Line "dout" is driven by carry multiplexer CY0 in circuit CT0, which circuit implements the first and second tests. Input line din<0> is coupled to input line G4 of circuit CT0, and hence provides the "0" input signal of carry multiplexer CY0. Input lines a<0> and b<0> are coupled to the input terminals of lookup table LUTA. Lookup table LUTA implements an OR-function of the signals on lines a<0> and b<0>, the result of which is inverted and XORed with the signal on line din<0>. The output terminal of lookup table LUTA is coupled to input line G1 of carry circuit CT0.

Input lines a<1> and b<1> are coupled to the input terminals of lookup table LUTB. Lookup table LUTB implements a NAND-function of the signals on lines a<1> and b<1>. The output terminal of lookup table LUTB is coupled to input line F2 of carry circuit CT0. Input line din<1> is coupled to the input terminal of inverter INVB. The output terminal of inverter INVB is coupled to input line F3 of carry circuit CT0. Input line F1 of carry circuit CT0 is tied low.

Carry circuit CT0, lookup tables LUTA and LUTB, and inverter INVB form a larger circuit CC0, which includes all of the logic required to implement the first two bits (two tests) of the priority encoder encoded in FIG. 1.

Circuits CC1–CC7 are similar to CC0, except that each circuit implements two AND tests instead of one OR and one AND. Therefore, the OR-gate implemented in lookup table LUTA of circuit CC0 is replaced in circuits CC1–CC7 by an AND-gate, as in lookup tables LUTC and LUTD.

Although this implementation may well be faster than a traditional LUT implementation, depending on carry chain and LUT delays, more CLB logic is consumed. Therefore, it may be desirable to take area requirements into consideration when making a decision as to whether or not to use the carry logic implementation. Typical synthesis software already has available options to select for either minimizing area or maximizing design performance. Synthesis software having the capability to implement priority logic using carry logic could easily use these existing options to decide which priority encoder implementation to use in a given design.

Detailed Description of a Third Embodiment

Figure 7:
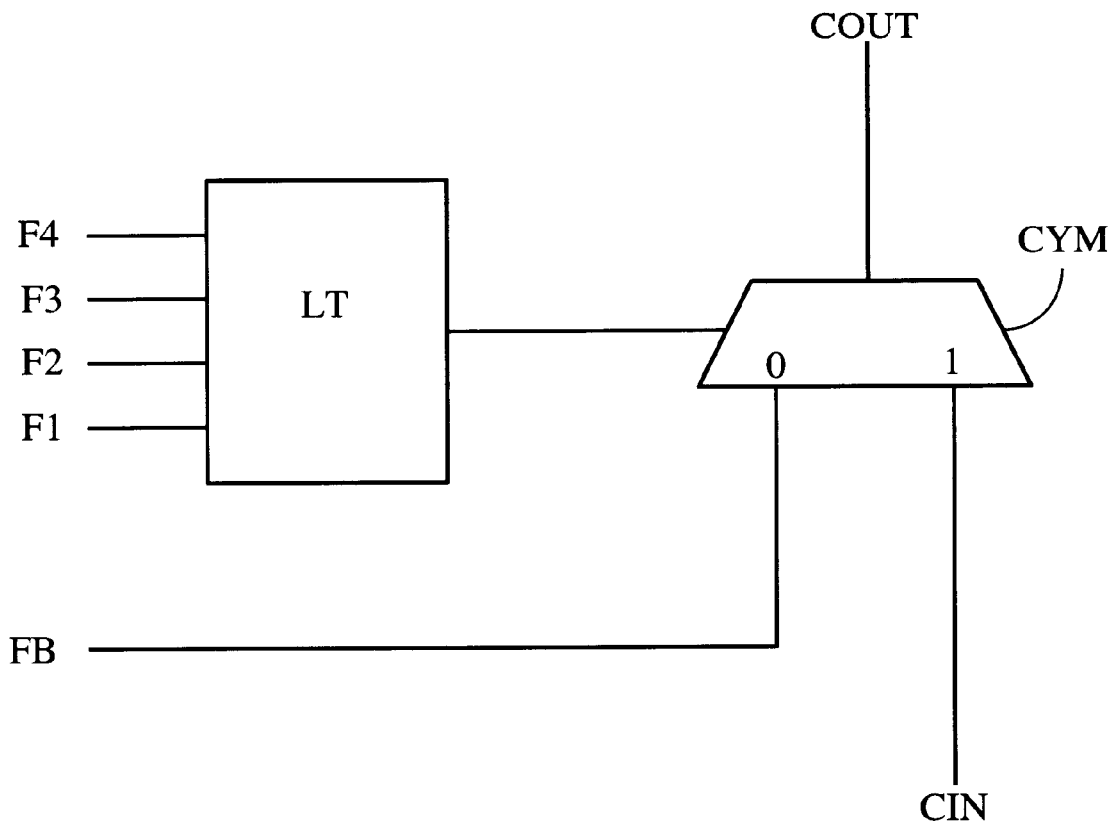
FIG. 7 shows the carry logic for an XC5200™ FPGA from Xilinx, Inc. (Virtex, XC4000E, and XC5200 are trademarks of Xilinx, Inc., assignee of the present invention.)

FIG. 7 shows a simplified portion of a CLB from the Xilinx XC5200™ FPGA. The XC5200 CLB is described in detail in pages 4-184 through 4-190 of the Xilinx Data Book, which pages are incorporated herein by reference. In this FPGA architecture, a single CLB includes four of the circuits shown in FIG. 7, as well as other logic. However, the circuit in FIG. 7 is treated as an independent entity for the purposes of this example. The circuit of FIG. 7 includes a carry multiplexer CYM having a "1" input terminal coupled to carry input line CIN, a "0" input terminal coupled to input line FB, a carry output terminal coupled to carry output line COUT, and a carry select terminal coupled to the output terminal of lookup table LT. Lookup table LT is driven by input lines F1, F2, F3, and F4. Carry output line COUT is coupled to carry input line CIN of another copy of this circuit placed above FIG. 7. Carry input line CIN is coupled to carry output line COUT of another copy of this circuit placed below FIG. 7.

Figure 8:
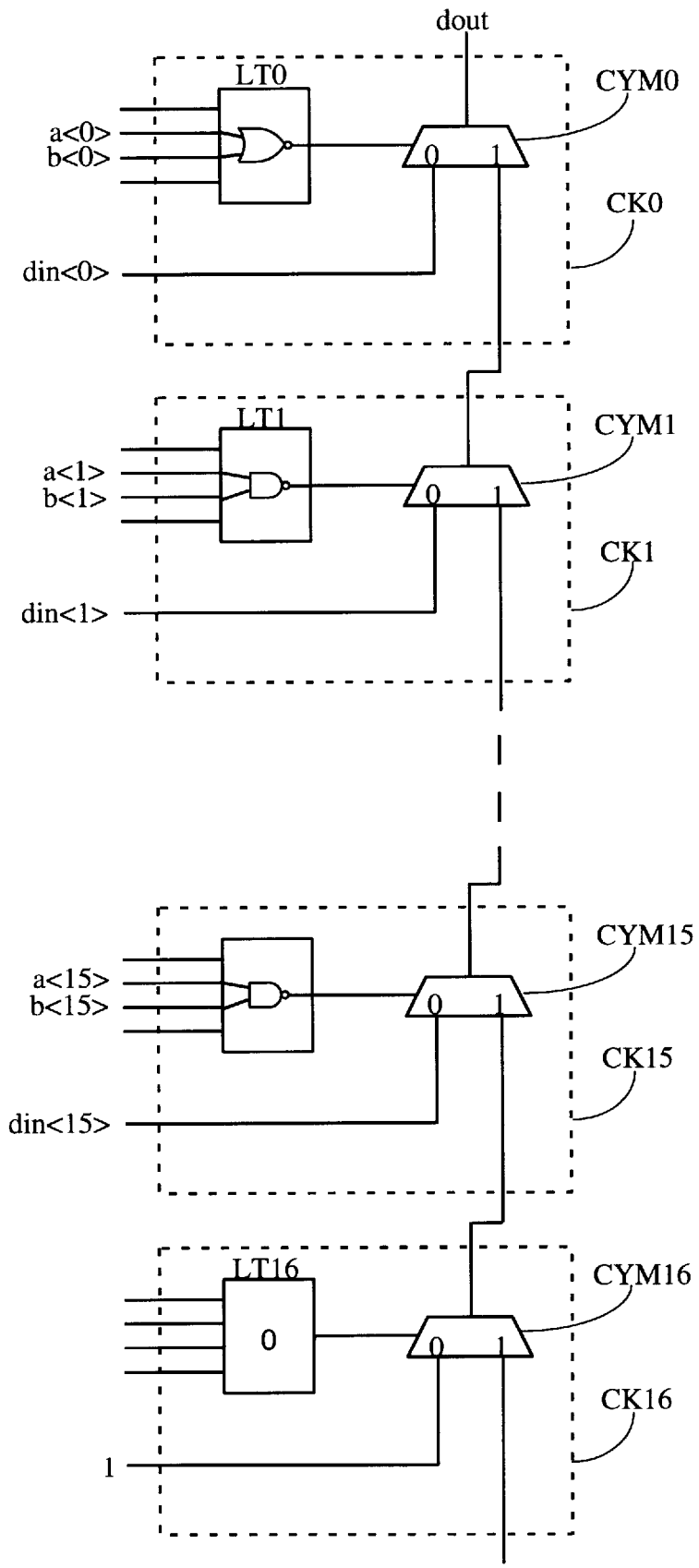
FIG. 8 shows a priority encoder implemented in the XC5200 FPGA carry logic.

FIG. 8 shows how the priority encoder of FIG. 1 is implemented in the circuit of FIG. 7, according to a third embodiment of the invention. This priority encoder requires 17 copies of the circuit of FIG. 7; one per test in the HDL code of FIG. 1, and one to place a high value on the carry input of the circuit implementing the 16th test (circuit CK15). The 17 circuits are labeled CK0, CK1, . . . , CK15, CK16. (Only four circuits are shown in FIG. 8, in order to simplify the drawing.)

In FIG. 8, the output signal for the priority encoder is carried on line "dout". Line "dout" is driven by carry multiplexer CYM0 in circuit CK0, which circuit implements the first test. Input line din<0> is coupled to the "0" input terminal of multiplexer CYM0. The "OR" function described in line 9 of FIG. 1 is implemented by lookup table LT0, which is programmed as a 2-input NOR function with lines a<0> and b<0> providing the input signals. If either of lines a<0>, b<0> carries a high signal, the lookup table LT0 drives the carry select signal low, and the signal on line din<0> is placed onto output line "dout".

If the first test was not passed, the output of lookup table LT0 is high, selecting the "1" input terminal of multiplexer CYM0, which is the carry out signal from circuit CK1. Circuit CK1 resembles circuit CK0, except that the test is different. As specified in line 11 of FIG. 1, the function implemented in lookup table LUT1 is a 2-input NAND function with lines a<1> and b<1> providing the input signals. Circuits CK2–CK15 are the same as circuit CK1 except for having different input lines. The carry in signal for multiplexer CYM15 in circuit CK15 must be a logic high, as dictated by lines 41–42 of FIG. 1 (else dout <=1'b1). To place a logic high on the carry input terminal of multiplexer CYM15, lookup table LT16 in circuit CK16 is programmed to select the "0" input terminal of multiplexer CYM16, and a high logic level is placed on the "0" terminal of multiplexer CYM15. The "1" input terminal of multiplexer CYM16 is ignored.

It has been demonstrated that the method of the present invention offers the advantage of significantly higher speed priority encoders than are produced by present synthesis methods. Thus it will be understood that the present invention provides a novel method for implementing a priority encoder in a programmable IC or a portion thereof.

The method of the invention for implementing priority encoders in carry logic has been described using several FPGA architectures as examples. It will be apparent to one skilled in the art after reading this specification that the present invention may be practiced with other FPGA architectures as well as those illustrated herein, as well as in other programmable ICs such as metal-programmable devices designed to emulate FPGAs. In addition, although the invention is described using Verilog if/else and case/switch statements, the invention can be applied to other hardware description languages and other forms of priority determination statements, including priority determination statements in languages yet to be developed.

Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. A method for implementing an HDL-specified priority encoder in a programmable IC, comprising the steps of:
   detecting a priority determination statement including a plurality of tests;
   implementing a first test in the statement using a first carry multiplexer having a carry input terminal and a carry output terminal, the first test being the test having the highest priority of the plurality of tests;
   implementing the next highest priority test in the statement using an additional carry multiplexer having a carry input terminal and a carry output terminal, the carry output terminal of the additional carry multiplexer being coupled to the carry input terminal of the carry multiplexer used in the previous step; and
   repeating the step of implementing the next highest priority test until each test in the statement has been implemented.

2. The method of claim 1, wherein:
   the first test is performed by logic implemented in a lookup table having an output terminal;
   the first carry multiplexer has a select terminal; and
   the lookup table output terminal is coupled to the select terminal.

3. The method of claim 1, wherein the programmable IC is an FPGA.

4. The method of claim 3, wherein the FPGA comprises an array of CLBs and the plurality of tests includes N tests, where N is at least the number of carry multiplexers in one CLB.

5. The method of claim 1, further comprising the steps of:
   counting a number of tests in the priority determination statement; and
   comparing the number of tests to a set threshold criterion, to determine whether it is appropriate to implement the statement using carry logic.

6. The method of claim 1, further comprising the steps of:
   checking a value of a user-specified variable selecting between minimizing area and maximizing performance; and
   using the value to determine whether it is appropriate to implement the statement using carry logic.

7. The method of claim 1, wherein the priority encoder is a multiplexer.

8. A method for implementing an HDL-specified priority encoder in a programmable IC, comprising the steps of:
   detecting an if/else statement including a plurality of tests;
   implementing a first test in the statement using a first carry multiplexer having a carry input terminal and a carry output terminal; and
   implementing each succeeding test in the statement using an additional carry multiplexer having a carry input terminal and a carry output terminal, the carry output terminal of the additional carry multiplexer being coupled to the carry input terminal of the carry multiplexer used in the previous step.

9. The method of claim 8, wherein:
   the first test is performed by logic implemented in a lookup table having an output terminal;
   the first carry multiplexer has a select terminal; and
   the lookup table output terminal is coupled to the select terminal.

10. The method of claim 8, wherein the programmable IC is an FPGA.

11. The method of claim 10, wherein the FPGA comprises an array of CLBs and the plurality of tests includes N tests, where N is at least the number of carry multiplexers in one CLB.

12. The method of claim 8, further comprising the steps of:
   counting a number of tests in the if/else statement; and
   comparing the number of tests to a set threshold criterion, to determine whether it is appropriate to implement the statement using carry logic.

13. The method of claim 8, further comprising the steps of:
   checking a value of a user-specified variable selecting between minimizing area and maximizing performance; and
   using the value to determine whether it is appropriate to implement the statement using carry logic.

14. The method of claim 8, wherein the priority encoder is a multiplexer.

15. A method for implementing an HDL-specified priority encoder in a programmable IC, comprising the steps of:
   detecting a case/switch statement including a plurality of tests;
   implementing a first test in the statement using a first carry multiplexer having a carry input terminal and a carry output terminal; and
   implementing each succeeding test in the statement using an additional carry multiplexer having a carry input terminal and a carry output terminal, the carry output terminal of the additional carry multiplexer being coupled to the carry input terminal of the carry multiplexer used in the previous step.

16. The method of claim 15, wherein:
   the first test is performed by logic implemented in a lookup table having an output terminal;
   the first carry multiplexer has a select terminal; and
   the lookup table output terminal is coupled to the select terminal.

17. The method of claim 15, wherein the programmable IC is an FPGA.

18. The method of claim 17, wherein the FPGA comprises an array of CLBs and the plurality of tests includes N tests, where N is at least the number of carry multiplexers in one CLB.

19. The method of claim 15, further comprising the steps of:

counting a number of tests in the case/switch statement; and comparing the number of tests to a set threshold criterion, to determine whether it is appropriate to implement the statement using carry logic.

20. The method of claim 15, further comprising the steps of:

checking a value of a user-specified variable selecting between minimizing area and maximizing design performance; and using the value to determine whether it is appropriate to implement the statement using carry logic.

21. The method of claim 15, wherein the priority encoder is a multiplexer.

* * * * *